US008571360B2

(12) United States Patent
Tay et al.

(10) Patent No.: US 8,571,360 B2
(45) Date of Patent: Oct. 29, 2013

(54) OPTOCOUPLER WITH LIGHT GUIDE DEFINING ELEMENT

(75) Inventors: Thiam Siew Gary Tay, Singapore (SG); Gopinath Maasi, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 252 days.

(21) Appl. No.: 12/945,474

(22) Filed: Nov. 12, 2010

(65) Prior Publication Data
US 2011/0235975 A1    Sep. 29, 2011

Related U.S. Application Data

(63) Continuation-in-part of application No. 12/729,943, filed on Mar. 23, 2010, now Pat. No. 8,412,006.

(51) Int. Cl.
*G02B 6/12* (2006.01)
*G02B 6/36* (2006.01)

(52) U.S. Cl.
USPC .................... 385/14; 385/39; 385/92; 385/94

(58) Field of Classification Search
USPC .......................................... 385/14, 39, 88–94
See application file for complete search history.

(56) References Cited

U.S. PATENT DOCUMENTS

| | | | | |
|---|---|---|---|---|
| 4,114,177 A | * | 9/1978 | King | ................................ 257/81 |
| 4,179,619 A | | 12/1979 | Cook | |
| 4,450,461 A | * | 5/1984 | Cook et al. | ........................ 257/82 |
| 5,150,438 A | | 9/1992 | Brown | |
| 5,329,131 A | * | 7/1994 | Wijdenes et al. | ............. 250/551 |
| 5,340,993 A | | 8/1994 | Salina | |
| 5,500,912 A | * | 3/1996 | Alonas et al. | .................... 385/37 |
| 5,614,131 A | * | 3/1997 | Mukerji et al. | ................. 264/1.9 |
| 5,751,009 A | * | 5/1998 | Anderson et al. | ............. 250/551 |
| 5,753,929 A | | 5/1998 | Bliss | |
| 6,246,123 B1 | * | 6/2001 | Landers et al. | ................ 257/787 |
| 6,556,750 B2 | | 4/2003 | Constantino et al. | |
| 6,756,689 B2 | | 6/2004 | Nam et al. | |
| 6,864,509 B2 | | 3/2005 | Worley | |
| 7,021,839 B2 | * | 4/2006 | Ho | .................................. 385/92 |

(Continued)

FOREIGN PATENT DOCUMENTS

EP    0103032    3/1984

OTHER PUBLICATIONS

Kek, Theng-Hui, et al., "Stacked LED Makes Compact Optocouplers", *Semiconductor Products Group Isolation Products Division Agilent Technologies Inc.* Apr. 1, 2005.

(Continued)

*Primary Examiner* — Daniel Petkovsek

(57) ABSTRACT

An optocoupler with a light guide defining element is presented. The light guide defining element has at least one cavity configured to define the shape of the light guide formed by a transparent encapsulant encapsulating the optical transmitter and receiver dies. The transparent encapsulant in liquid form may be injected into the cavity prior to a curing process to harden the encapsulant into a light guide with a predetermined shape. The cavity of the light guide element may be defined by a reflective surface having micro-optics formed thereon. A multichannel optocoupler with multiple transmitter and/or receiver dies having such light guide defining element is also presented. The light guide defining element may have a single cavity enveloping all the optical transmitter or receiver dies, or a multiple cavities by having a pair of transmitter and receiver dies inside each cavity.

19 Claims, 7 Drawing Sheets

(56) References Cited

U.S. PATENT DOCUMENTS

| | | |
|---|---|---|
| 7,112,457 B2 | 9/2006 | Kek et al. |
| 7,476,890 B2 | 1/2009 | Kishi |
| 7,589,338 B2 * | 9/2009 | Liu et al. .................. 250/551 |
| 7,748,912 B2 * | 7/2010 | Ho et al. .................... 385/92 |
| 7,868,465 B2 | 1/2011 | Otremba et al. |
| 7,956,338 B2 * | 6/2011 | Keita et al. ................ 250/551 |
| 8,106,406 B2 | 1/2012 | Liu et al. |
| 8,346,033 B2 | 1/2013 | Kubots |
| 2007/0045882 A1 | 3/2007 | Ho |
| 2009/0174048 A1 | 7/2009 | Liu et al. |
| 2011/0235974 A1 * | 9/2011 | Tay et al. ................... 385/39 |

OTHER PUBLICATIONS

"Optocoupler Solutions", Lit No. 250001-006 (2010), Fairchild Semiconductor, www.fairchildsemi.com 2010.

Basso, Christophe , "Dealing With Low-Current Optocouplers", Sep. 1, 2009, powerelectronics.com Sep. 1, 2009.

* cited by examiner

OPTOCOUPLER WITH LIGHT GUIDE DEFINING ELEMENT

This is a continuation-in-part of U.S. application Ser. No. 12/729,943 filed on Mar. 23, 2010 now U.S. Pat. No. 8,412,006, which application is incorporated by reference herein.

BACKGROUND

A galvanic isolator provides a mean for moving a signal from one electrical circuit to another electrical circuit when the two electrical circuits must otherwise be electrically isolated from one another. Usually the two electrical circuits operate at different voltages, and thus, must be electrically isolated. For example, consider an application in which a 5V battery powered controller board is utilized to control a motor circuit operating at 240V. In this example, it is essential to electrically isolate the 240V motor circuits from the 5V controller circuit, while permitting the 5V controller circuit to send or receive signals from the 240V motor circuit. In this type of application, a galvanic isolator may be used to provide voltage and noise isolation, while permitting the information exchange between the two circuit systems. For electrical system with more than two circuits operating at different voltages, a multichannel galvanic isolator may be used.

There are three main types of galvanic isolators. The first type is a wireless radio frequency transceiver, in which a signal is sent from one circuit to another circuit via a wireless signal. The second type is a magnetic isolator in which the signal is transmitted from one circuit to another circuit by means of a magnetic field. The third type is an optocoupler in which the signal is transferred between circuits by means of light waves. Galvanic isolators may be used in applications involving voltage operating in kilovolts. Magnetic isolators and radio frequency isolators may have limitation in shielding noise from one circuit system to another circuit system because the entire circuit in the isolators may be susceptible to the strong magnetic field or the radio frequency waves that may induce voltage or current. However, optocouplers, couplings signals by means of light waves, do not induce noise in the same way that magnetic isolators or radio-frequency transceivers induce noise.

Generally, an optocoupler comprises an optical transmitter die and an optical receiver die. The optical transmitter die and the optical receiver die may be housed in a single package. A multichannel optocoupler may have more than one pair of optical transmitter or receiver dies. A signal is usually transmitted from the optical transmitter die to the optical receiver die. In order to prevent light loss, a light guide is typically employed. In most cases, the light guide is formed by dispensing a transparent encapsulant in liquid form over the optical transmitter and receiver dies. The transparent encapsulant is then hardened through a curing process into a light guide. The shape of the light guide may be dependent on the viscosity of the encapsulant, and therefore, the shape of the light guide may be difficult to control. This issue of controlling the light guide shape may be more severe for an optocoupler with large dies or for a multichannel optocoupler.

BRIEF DESCRIPTION OF THE DRAWINGS

Illustrative embodiments by way of examples, not by way of limitation, are illustrated in the drawings. Throughout the description and drawings, similar reference numbers may be used to identify similar elements.

DETAILED DESCRIPTION

Figure 1:
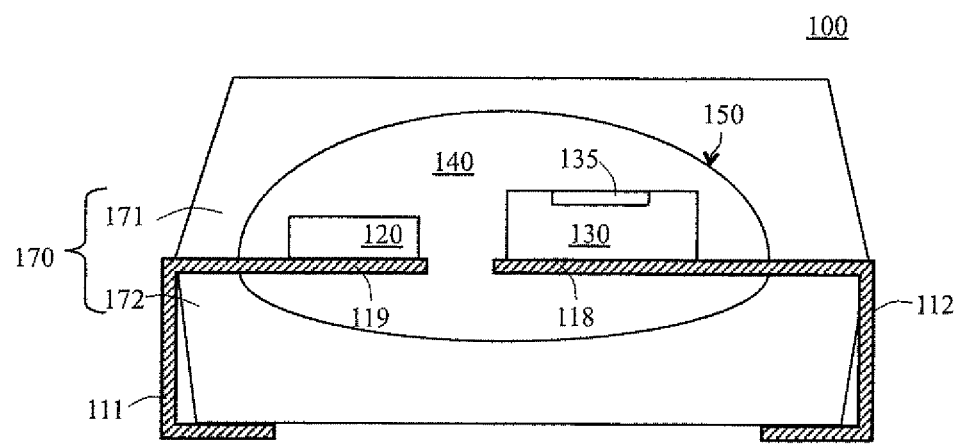
FIG. 1 illustrates a cross-sectional view of an optocoupler in a lead frame package.

FIG. 1 illustrates a cross-sectional view of an optocoupler 100 in a lead frame package. The optocoupler 100 comprises a plurality of conductors 111-112, an optical transmitter die 120 and an optical receiver die 130. The plurality of conductors 111-112 are made from conductive material and may be formed from a lead frame. The plurality of conductors 111-112 may be known as leads or conductive traces. The conductors 111-112 may be extended to form conductive pads 118-119, such that the conductive pad 118-119 may be configured to hold the optical transmitter 120 and receiver 130 dies. The plurality of conductors 111-112 may be configured as a mean to connect the dies 120 and 130 to external circuitry (not shown). For example, the plurality of conductors 111-112 may be extended to the edge or the bottom of the optocoupler, in order to serve as electrical contacts to external circuitry (not shown).

The optical transmitter die 120 may be a light emitting diode (referred hereinafter as LED) or any light source capable of emitting light. The optical transmitter die 120 may be an integrated circuit with an embedded LED and driver circuit. Depending on the design requirements, control circuitry may be integrated into the optical transmitter die 120. The optical transmitter die 120 may be configured to be powered by a first power supply (not shown) by means of the conductor 111. The optical transmitter die 120 may be operable to emit light in accordance with a logic signal from an external circuit (not shown) operating on the first power supply (not shown). For example, a logic signal "HIGH" may be transmitted to the optical transmitter die 120 through conductor 111. The optical transmitter die 120 would, in response, emit light output indicating the "HIGH" signal.

The optical receiver die 130 may comprise a photo-detector 135, such as a photo-diode or a photo-transistor. The optical receiver die 130 may be an integrated circuit with an embedded photo-detector 135, or alternatively, an amplifier circuit (not shown) to amplify photocurrent generated by the photo-detector 135. Depending on the design requirements, control circuitry may be integrated into the optical receiver die 130 to provide signal processing. The optical receiver die 130 may be configured to be powered by a second power supply (not shown) through the conductor 122. The optical receiver die 130 may be operable to receive a signal in the form of light emitted from the optical transmitter die 120.

The optical transmitter 120 and receiver 130 dies may be encapsulated by a transparent encapsulant, such as clear epoxy, silicon or other similar materials to form a light guide 140. The transparent encapsulant is then encapsulated by an opaque encapsulant to form a body 170 comprising an upper portion 171 and a lower portion 172. The upper 171 and lower 172 portions may be made using two different tools in a molding process. The opaque encapsulant may be plastic, ceramic, or any other substantially opaque or black compound used to form the body 170 of a packaging. Optionally the transparent encapsulant may be enveloped by a reflective material 150, capable of reflecting light before being encapsulated in the opaque encapsulant, such as a white epoxy, a metallic material, or other similar reflective material.

The transparent encapsulant forms the light guide 140 for transmitting the light emitted from the optical transmitter die 120 to the optical receiver die 130. The transparent encapsulant may be formed by dispensing an encapsulant in liquid form to encapsulate both the optical transmitter 120 and receiver 130 dies. The liquid transparent encapsulant is then cured into a solid, forming the light guide 140. The size of the light guide 140 is controlled by controlling the amount of the liquid encapsulant dispensed, and may depend a great deal on the viscosity of the liquid encapsulant. For a small light guide 140, relying on the viscosity and the amount of the transparent epoxy dispensed may be sufficient to accomplish a substantially consistent size and shape without too much process variation. However, for larger dies 120-130 or for a multichannel optocoupler, the process variation in terms of size and shape of the light guide 140 may be significant, resulting in inconsistently sized and shaped light guides.

Figure 2:
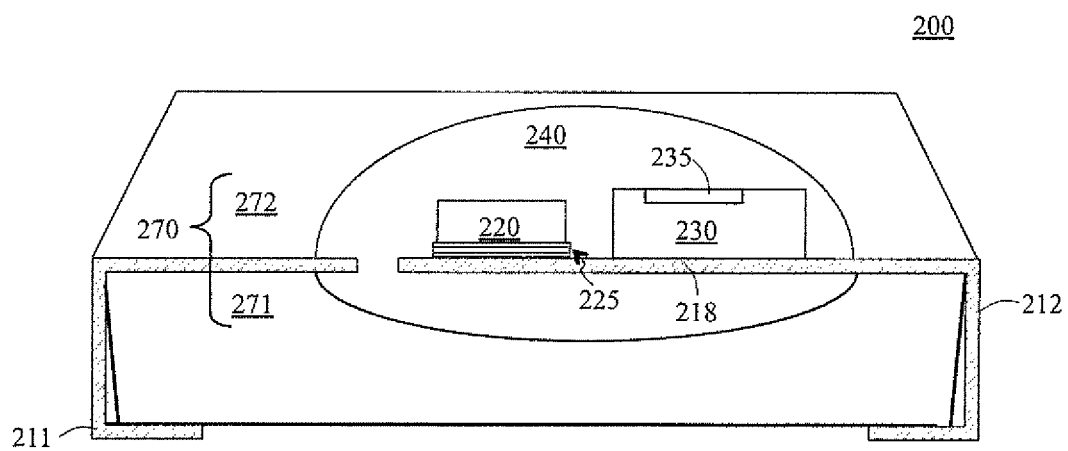
FIG. 2 illustrates a cross-sectional view of an optocoupler in a lead frame package having an optical transmitter die and a receiver die attached to a common conductive pad.

One way to obtain a more consistent light guide 140 is by making the distance of the optical transmitter 120 and receiver 130 dies closer to each other so that the light guide 140 is small. This may be accomplished by attaching the dies 120-130 on a common conductive pad 118-119 as shown in FIG. 2. However, as the optical transmitter 120 and receiver 130 dies may be connected to two different power supplies, it is essential to ensure proper electrical and noise isolation between the two dies 120-130.

FIG. 2 illustrates a cross-sectional view of an optocoupler 200 in a lead frame type packaging. The optocoupler 200 comprises a plurality of conductors 211-212, an optical transmitter die 220, an optical receiver die 230, a light guide 240 formed by a transparent encapsulant, and a body 270 having an upper portion 271 and a lower portion 272. The optical receiver die 230 further comprises a photo-detector 235. As shown in the embodiment of FIG. 2, one of the conductors 211-212 is extended to form a conductive pad 218. The optical transmitter 220 and receiver 230 dies are attached to the common conductive pad 218. The optocoupler 200 in FIG. 2 is similar to the optocoupler 100 in FIG. 1 except that both the optical transmitter 220 and receiver 230 dies are attached to the common conductive pad 218. In the embodiment shown in FIG. 2, the optical transmitter die 220 may be electrically connected to the conductor 211 but the optical receiver die 230 may be connected to the conductor 212.

As shown in the embodiment of FIG. 2, the optical transmitter die 220 is attached to the conductive pad 218 via three layers of materials 225, comprising an isolation layer sandwiched between two securing layers. The isolation layer provides electrical isolation for the optical transmitter die 220 from the conductive pad 218, which is electrically connected to the optical receiver die 230. The isolation layer may be a layer of glass, a polyimide, or similar electrically insulating materials. The isolation layer may or may not have sufficient adhesive properties to hold the optical transmitter die 220 onto the conductive pad 218.

The securing layers may be a layer of silicon dioxide, silicon, nitride, benzo cyclo butane (BCB) or any other suitable insulating adhesive material. The securing layers may be an epoxy material suitable for die attachment use. Such an epoxy includes, but is not limited to, those epoxies sold by Tra-con of Massachusetts, USA. The securing layers have sufficient adhesive properties to hold the optical transmitter die 220 and the isolation layer onto the conductive pad 218. The three layers of materials 225 may be electrically insulating, and thus capable of providing the optical transmitter die 220 voltage and noise isolation from the conductive pad 218, which is electrically connected to the optical receiver die 230.

The securing layers may be in liquid form at the beginning of manufacturing process, but may be hardened later in the of manufacturing process, for example through exposure to heat or UV light to form a solid layer. The isolation layers may prevent the optical transmitter die 220 from physically touching the conductive pad 218 at the beginning of manufacturing process when the securing layers may be in liquid form.

In the embodiment shown in FIG. 2, the optical transmitter die 220 is attached to the conductive pad 218 through the three layers of materials 225, while the optical receiver die 230 is attached directly to the conductive pad 218. This design may also be reversed. The choice may be based on various design considerations, such as relative height profiles, thermal conductance requirements, power and ground requirements of each die 220-230, and the like.

Figure 3:
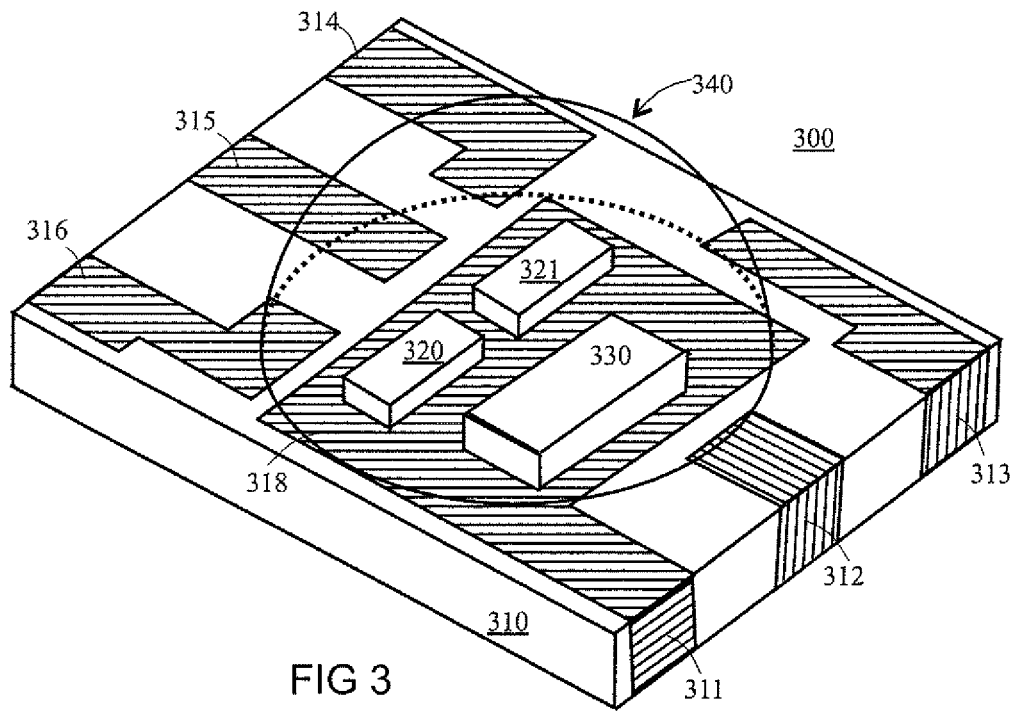
FIG. 3 illustrates an embodiment of a partially completed multichannel optocoupler having two optical transmitters and one optical receiver on a printed circuit board encapsulated by a transparent encapsulant, without wire bonds and without an encapsulant.

Optocouplers with more than one pair of transmitter 220 and receiver 230 dies are known as multichannel optocouplers. FIG. 3 shows a partially completed multichannel optocoupler 300 without wire bonds or an opaque encapsulant. The multichannel optocoupler 300 comprises a substrate 310, two optical transmitter dies 320-321 and an optical receiver die 330. The dies 320-321 and 330 are encapsulated by a transparent encapsulant forming a light guide 340. The substrate 310 may be a printed circuit board (referred hereinafter as PCB). The substrate 310 further comprises a plurality of conductors 311-316. In the case of a PCB, the conductors 311-316 may also be known as conductive traces. One of the conductors 311-316 may be extended to form a conductive pad 318. The optical transmitter dies 320-321 and the optical receiver die 330 may be attached to the conductive pad 318. One of the dies 320-321 and 330 may be attached directly to the conductive pad 318, while the other dies 320-321 and 330 may be attached to the conductive pad 318 by means of the three layers of insulating materials 225, shown in FIG. 2.

Although having multiple dies 320,321 and 330 attached to the same conductive pad 318 may reduce the size of the light guide 340, making the light guide 340 in a consistent size may still be challenging, as the number of dies 320-321 and 330 increases. In order to encapsulate all of the dies 320-321 and 330, the size of light guide 340 unavoidably will increase. One effective way to make the light guide 340 with a consistent size and shape is to use light guide defining elements 460, as shown in the embodiment in FIG. 4.

Figure 4:
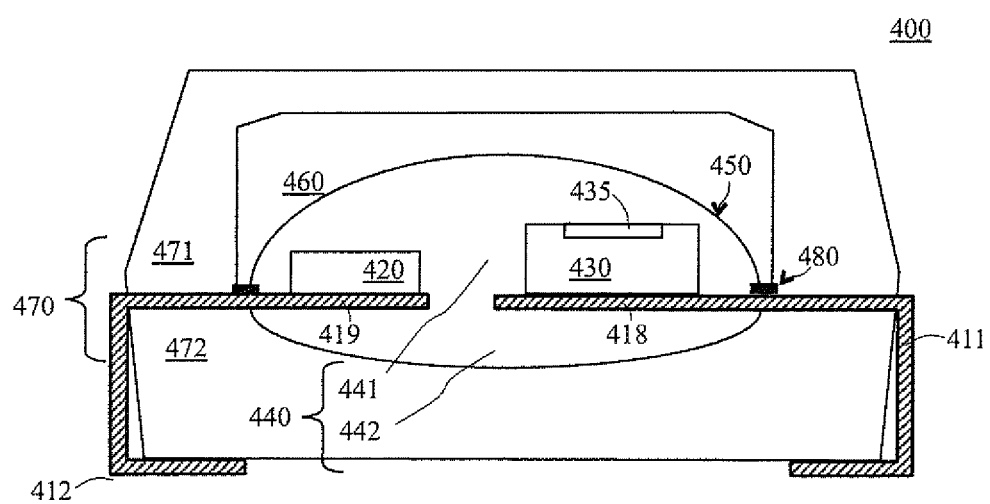
FIG. 4 illustrates a cross-sectional view of an optocoupler with light guide defining element in a lead frame package.

The optocoupler 400 in FIG. 4 comprises a plurality of conductors 411-412 that may be leads of a lead frame, an optical transmitter die 420, an optical receiver die 430 that may have a photo-detector 435, a light guide 440 formed by a transparent encapsulant encapsulating the dies 420-430, a light guide defining element 460, and a body 470 formed by an opaque encapsulant comprising an upper portion 471 and a lower portion 472. The upper 471 and lower 472 portions of the body 470 may be formed using two different tools in a molding process. Similarly, the light guide 440 may be divided into an upper portion 441, and a lower portion 442. Some of the conductors may be extended to form conductive pads 418-419 for receiving the dies 420-430. Similar to the optocouplers 100 and 200 shown in the embodiments of FIG. 1, and FIG. 2, respectively, the optical transmitter die 420 may be connected to a first power supply (not shown) while the optical receiver die 430 may be connected to a second power supply (not shown) isolated from the first power supply (not shown).

As shown in FIG. 4, the light guide defining element 460 may have a cavity with a reflective surface 450 defining the light guide 440 formed by the transparent encapsulant. The light guide defining element 460 may define any suitable shape. However, the cavity may define a suitable shape for the light guide 440, which is usually a substantially dome shape. The light guide defining element 460 may be formed of polycarbonate, high index plastic, acrylic plastic or any other similar materials. In order to better control the regulation of light by the reflective surface 450, optionally micro-optics can be formed at the reflective surface 450. The light guide defining element 460 may be attached to the plurality of conductors 411-412 through a non-conductive epoxy 480. Such non-conductive epoxy may include, but are not limited to, those epoxies sold by Henkel Corporation, Sumitomo Metal Mining Co. Ltd., METAL MINING Co., Ltd, and Epoxy Technology Inc. Other attachment methods, such as a non-conductive adhesive die attach method or a heat staking method may also be employed to attach the light guide defining element 460 to the plurality of conductors 411-412.

One possible method to make the optocoupler 400 shown in the embodiment of FIG. 4, is by first attaching the dies 420-430 to one side of the conductive pads 418-419. The next step may be the wire bond process, in which the dies 420-430 may be bonded to their respective conductors 411-412 to establish electrical connection. It should be noted that there may be more conductors 411-412 than shown in the figures. After wire bonding, the light guide defining element 460 may be attached to conductors 411-412 via the non-conductive epoxy 480, such that the dies 420-430 are located in the vicinity of the cavity defined by the reflective surface 450. The transparent epoxy in liquid form is then injected into the cavity to form the light guide 440.

The upper portion 441 of the light guide 440 is bounded by the light guide defining element 460. In order to increase the reliability performance and to fully encapsulate the dies 420-430, the amount of transparent encapsulant injected may be more than the volume defined by the cavity of the light guide defining element 460. As shown in the embodiment of FIG. 4, the light guide 440 further comprises a lower portion 442 located outside the cavity of the light guide defining element 460. The shape and size of the lower portion 442 has less impact on the optical performance, as the lower portion 442 is located on the opposite side of the optical dies 420-430. The size and shape of the lower portion 442 may not be tightly controlled for cost considerations.

Next, the liquid transparent encapsulant may then be cured into solid form. The light guide defining element 460 and a portion of the conductors 411-412 may then be encapsulated by the opaque encapsulant forming the lower portion 472 of the body 470 through a first molding process. The lower portion 472 of the body 470 may be referred to as substrate. The lower portion 472 of the body 470 may then go through a second molding process to form the upper portion 471 of the body 470. Finally, the conductors 411-412 may be separated from the lead frame (not shown) and bent into the required shape.

As shown in the embodiment of FIG. 4, the shape of the upper portion 441 of the light guide 440 may be substantially a dome shape following the shape of the light guide defining element 460. Technically, the lower portion 442 of the light guide 440 may be made substantially flat or any other convenient, cost effective shape. However, in order to improve reliability performance and to prevent arching or delamination, the lower portion 442 may be made into a smaller, substantially domed shape, similar to the upper portion 421. Alternatively, a tape 590 (See FIG. 5) made from Mylar, Polyimide, Melinex, or any other similar material may be attached as or to the lower portion 442 of the light guide 440 to increase the reliability performance. This is shown in FIG. 5, in which tape 590 substantially replaces some or all of the lower portion 442.

Figure 5:
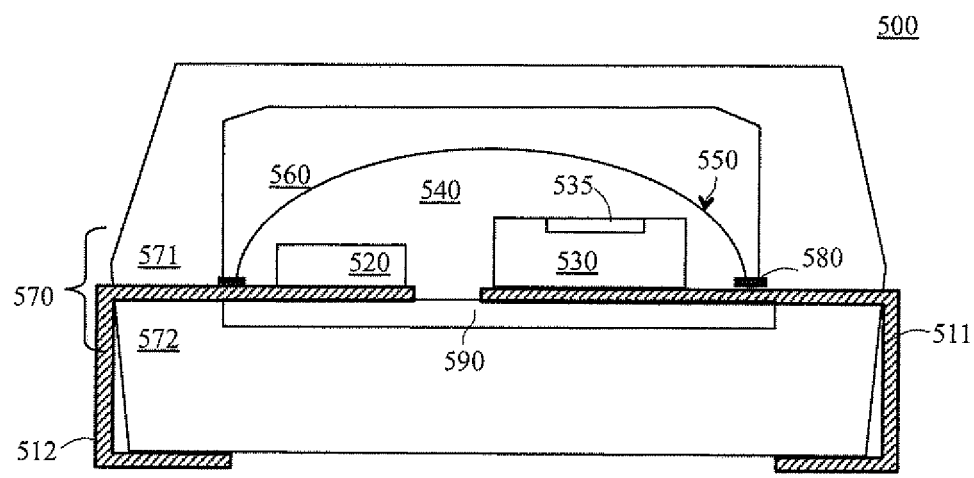
FIG. 5 illustrates a cross-sectional view of an optocoupler with light guide defining element and a tape in a lead frame package.

FIG. 5 shows an embodiment of an optocoupler 500 similar to the optocoupler 400, except that a tape 590 is employed to increase reliability performance. The optocoupler 500 comprises a plurality of conductors 511-512, an optical transmitter die 520, an optical receiver die 530 having at least one photo-detector 535, a light guide 540, a light guide defining element 560, and a body 570 having an upper 571 portion and a lower portion 572. The light guide defining element 560 is attached to the conductors 511-512 through a non-conductive epoxy 580. Optionally, the reflective surface 550 of the light guide defining element 560 may have micro optics configured to direct light emitted from the optical transmitter die 520 to the optical receiver die 630. Unlike the optocoupler 400 with a substantially large bottom portion 442, as shown in FIG. 4, the light guide 540 in the optocoupler 500 defines a semi-dome shape almost without the lower portion 442 shown in FIG. 4. In contrast, the tape 590 is used to strengthen the structure of the light guide 540. The tape 590 may be made adhesive and may be attached to the light guide 540 after the transparent encapsulant is cured. Another one of the advantages of using the tape 590 is that the tape 590 enables the lower portion 442 (See FIG. 4) to be substantially flat, in order to increase the efficiency of the light guide 540. As the tape 590 may be substantially flat on the lower portion 442, the height of the optocoupler may also be decreased. In another embodiment, the optocoupler 500 shown in FIG. 5 may not include the light guide defining element 560. The shape of the light guide 540 depends on the viscosity of the encapsulant. However, the tape 590 may be able to reduce the process variations with respect to the shape and size of the light guide 540.

Figure 6:
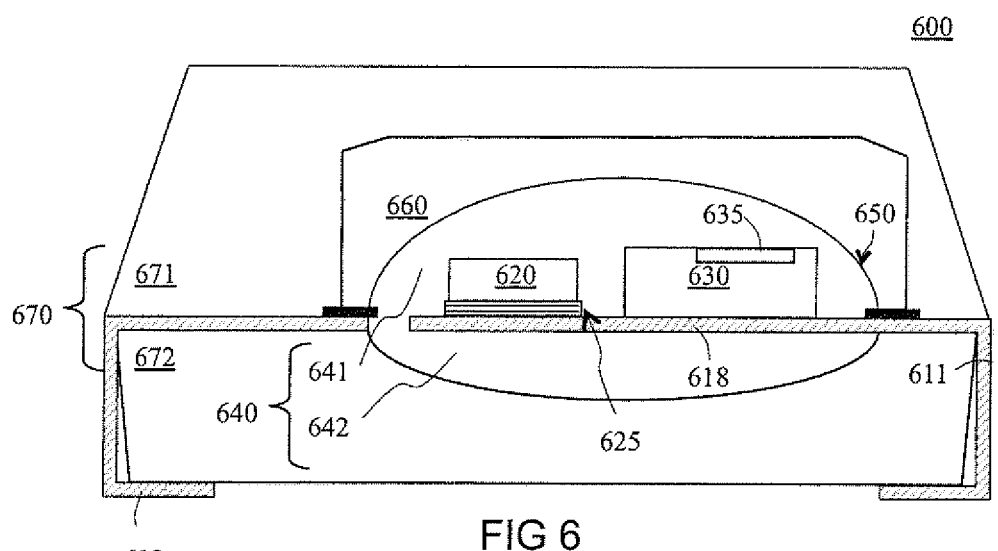
FIG. 6 illustrates a cross-sectional view of an optocoupler having an optical transmitter die and a receiver die attached to a common conductive pad with light guide defining element.

FIG. 6 shows another embodiment of an optocoupler 600, which is similar to the optocoupler 400, shown in FIG. 4. The optocoupler 600 may comprise a plurality of conductors 611-612 with one of the conductors 611-612 being extended to form a common conductive pad 618, an optical transmitter die 620, an optical receiver die 630 having at least one photo-detector 635, a light guide 640 formed by transparent encapsulant, a light guide defining element 660 and a body 670 having an upper portion 671 and a lower portion 672. Optionally, micro-optics may be located at the reflective surface 650 of the light guide defining element 660. The light guide 640 may comprise an upper portion 641 and a lower portion 642, similar to the optocoupler 400, shown in FIG. 4.

One difference between the optocoupler 600 and the optocoupler 400 shown in FIG. 4 is that both the optical transmitter 620 and receiver 630 dies are attached to the common conductive pad 618. The optical transmitter 620 may be attached to the common conductive pad via three layers of materials 625, comprising an isolation layer sandwiched between two securing layers. Having the optical transmitter 620 and receiver 630 dies attached to the common pad 618 enables the light emitted by the optical transmitter die 620 to travel a shorter distance before reaching the optical receiver die 630. In addition, the light guide defining element 660 ensures that the light guide 640 will be formed of a consistent size and shape. Therefore, the efficiency of the light guide 640 shown in FIG. 6 may theoretically be greater than the embodiment shown in FIG. 4.

Figure 7:
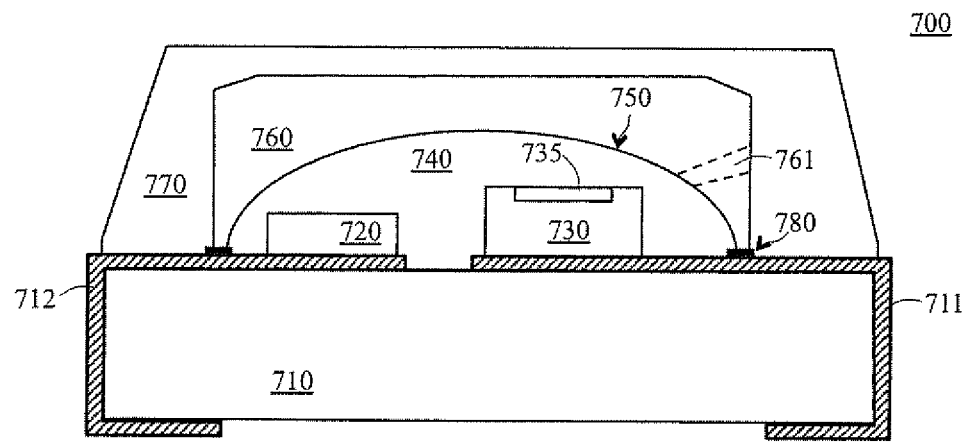
FIG. 7 illustrates a cross-sectional view of an optocoupler with light guide defining element attached to the printed circuit board.

FIG. 7 shows an embodiment of an optocoupler 700 using a PCB. The optocoupler 700 comprises a substrate 710, an optical transmitter 720, an optical receiver 730 with at least one photo-detector 735, a light guide 740, a light guide defining element 760, and an opaque encapsulant 770. The substrate 710 may be a PCB having a plurality of conductors 711-712 located at both sides of the substrate 710. Unlike optocouplers 400, 500, and 600, the light guide defining element 760 in the optocoupler 700 may be attached anywhere on the substrate 710 by means of non conductive epoxy 780, rather than being limited to only attaching to the conductors 711-712. The light guide defining element 760 may have one or more optional apertures 761 for dispensing the liquid form transparent encapsulant into the cavity of the light guide defining element 760. Optionally, more apertures 761 may be formed at the light guide defining element 760 to function as air escape holes to prevent air from being trapped inside the cavity.

Figure 8A:
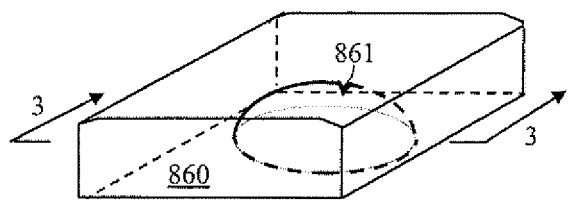
FIG. 8A illustrates a perspective view of a light guide defining element.
Figure 8B:
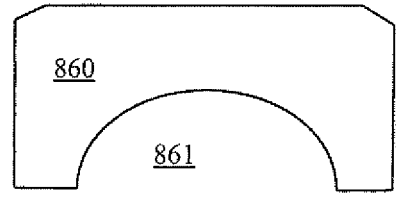
FIG. 8B illustrates a cross-sectional view of the light guide defining element along line 3-3.
Figure 8C:
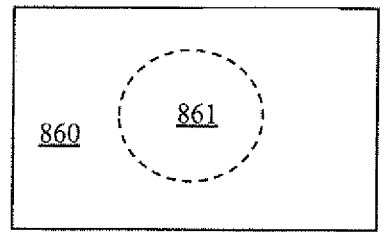
FIG. 8C illustrates a top view of the light guide defining element.

FIGS. 8A-8C show various views of the light guide defining element 860. FIG. 8A shows a perspective view of the light guide defining element 860. FIG. 8B shows a cross-sectional view of the light guide defining element 860 taken along line 3-3 shown in FIG. 5A. FIG. 8C shows a top view of the light guide defining element 860. The light guide defining element 860 may define a substantially rectangular shape having a cavity 861 of a substantially dome shape. The light guide defining element 860 may define any shape suitable to be attached to conductors 411-412 (See FIG. 4) or substrate 710 (See FIG. 7). The cavity 861 may define any shape suitable to reflect light from the optical transmitter die 720 toward the optical receiver die 730, shown in FIGS. 1-7. Optionally, the surface defining the cavity 861 may comprise a reflective material, a semi-reflective material, or micro-optics to control the distribution of light. Typically, there may be one cavity 861 in the light guide defining element 860. However, for multichannel optocouplers, there may be more than one cavity 861, as shown in FIG. 9.

Figure 9:
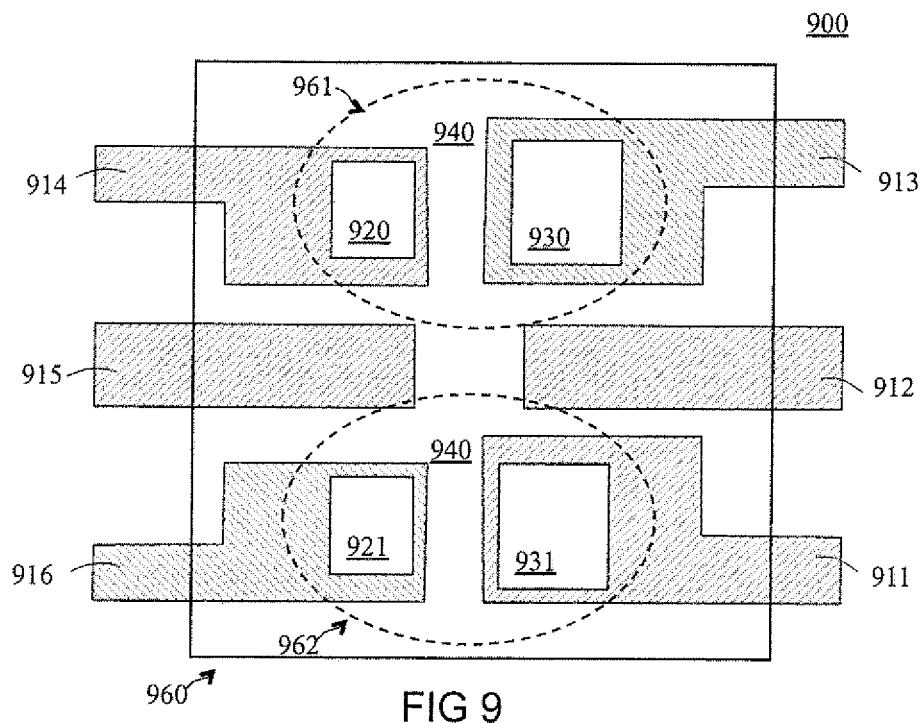
FIG. 9 illustrates a top view of a multichannel optocoupler with a light guide element having two cavities.

FIG. 9 is an embodiment showing a top view of a multichannel optocoupler 900 without wire bond and without the opaque encapsulant. The optocoupler 900 comprises a plurality of conductors 911-916, a plurality of optical transmitter dies 920-921, a plurality of optical receiver dies 930-931, and a light guide defining element 960. The light guide defining element 960 comprises a plurality of cavities 961-962, each defining a light guide 940, each coupling an optical transmitter and an optical receiver. A first pair of optical transmitter 920 and receiver 930 dies may be located within or in the vicinity of the first cavity 961, whereas a second pair of optical transmitter 921 and receiver 931 dies may be located within or in the vicinity of the second cavity 962. With this arrangement, crosstalk between the first and second pairs of transmitter dies 920-921 and receiver dies 930-931 may be minimized.

Figure 10:
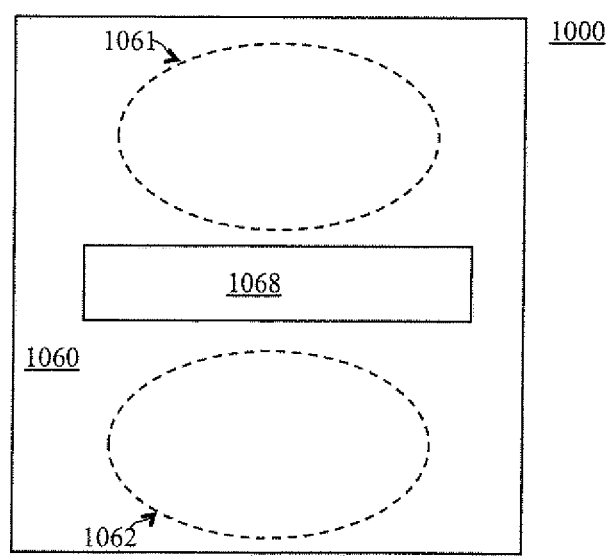
FIG. 10 illustrates a top view of a light guide defining element for a multichannel optocoupler with a light separation element.

In order to further optically isolate the two cavities 960-961, an optical separation element 1068, shown in FIG. 10, may be utilized. FIG. 10 illustrates a top view 1000 of a light guide defining element 1060 having a plurality of cavities 1061-1062. The optical separation element 1068 may be merely a void defined within the body of the light guide defining element 1060, so that light may be reflected through total internal reflection. Alternatively, the optical separation element 1068 may be formed by filling the void defined in the body of the light guide defining element 1060 with a substantially opaque encapsulant material, such as the material used to form the body 470 of the optocoupler 400, as shown in FIG. 4.

Figure 11:
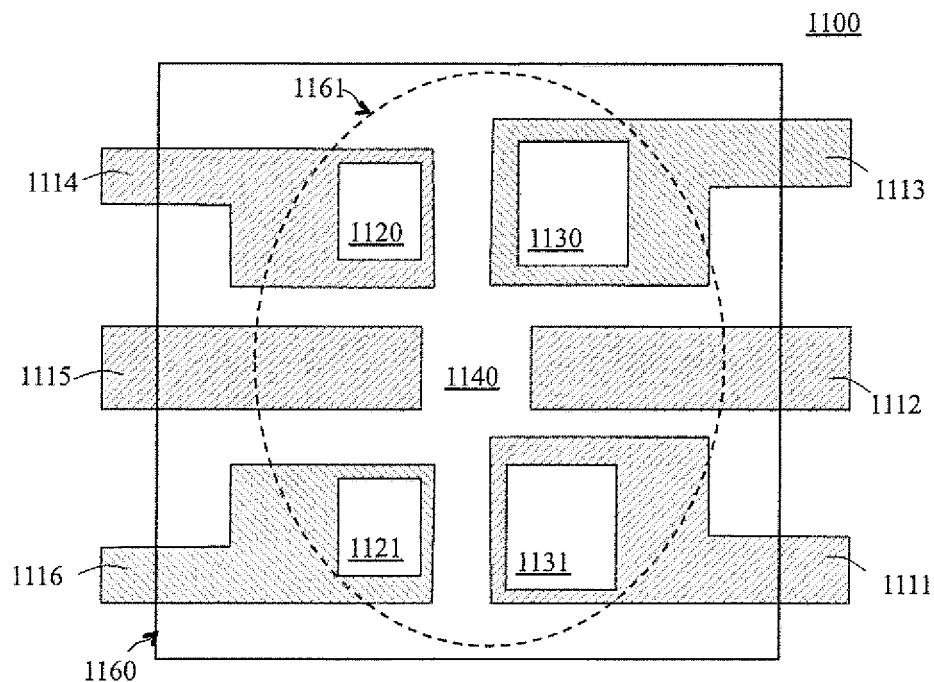
FIG. 11 illustrates a top view of a multichannel optocoupler with a light guide defining element having a single cavity.

In some situations, the optical transmitter 920-921 and receiver 930-931 dies may not be separated in different cavities 960-961 as shown in FIG. 9, because the signal from an optical transmitter die 920 may be received by any one of the two receiver dies 930-931. In such a situation, only one cavity 960 may be used. This situation is shown in the embodiment illustrated in FIG. 11. FIG. 11 illustrates a multichannel optocoupler 1100 without wire bonds and without the opaque encapsulant. The multichannel optocoupler 1100 comprises a plurality of conductors 1111-1116, optical transmitter dies 1120-1121, optical receiver 1130-1131 dies, a light guide defining element 1160, and a light guide 1140. All the optical transmitter dies 1120-1121 and receiver 1130-1131 dies may be encapsulated within the light guide 1140 in a single cavity 1161, as shown in FIG. 11.

Figure 12:
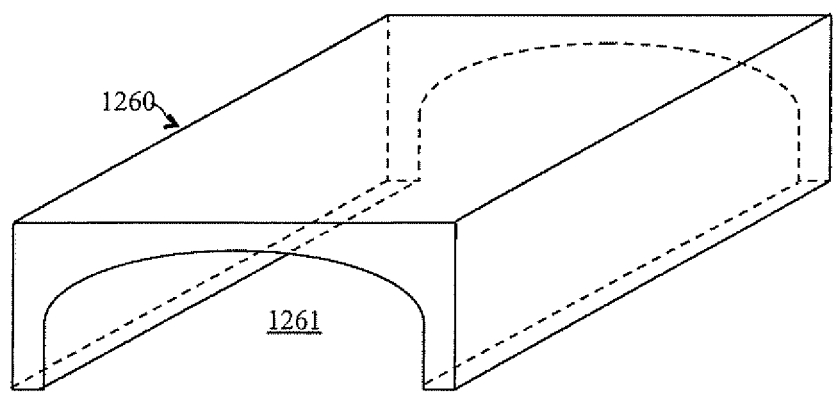
FIG. 12 illustrates a perspective view of a light guide defining element having a channel adapted to be cascaded to another light guide defining element of an adjacent optocoupler.

In the case in which the optocoupler 1100 may be coupled to a neighboring optocoupler 1100, so that signals may be transmitted from any of the optical transmitter dies 1120-1121 to any of the optical receiver dies 1130-1131 of a neighboring optocoupler 1100, the light guide defining element 1100 may not define a dome shape as in FIG. 11. In such a situation, the light guide defining element 1260 may define a channel 1261 that may be open ended at both ends of the longitude axis, as shown in FIG. 12. By co-axially aligning the channels 1261 of two adjacent optocouplers (not shown), optical communication between the two different optocouplers may be achieved.

Figure 13:
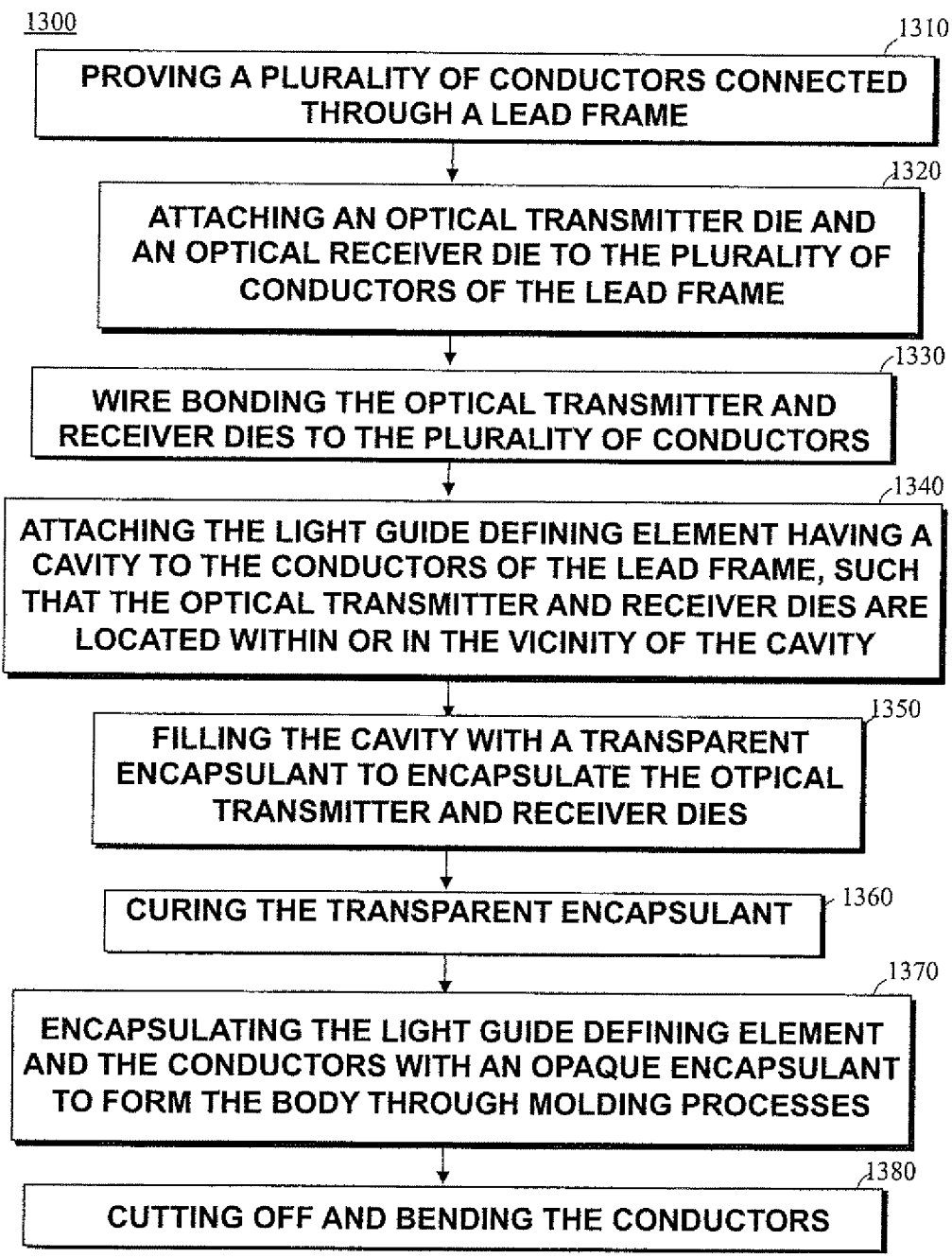
FIG. 13 illustrates a method for manufacturing an optocoupler with a light guide defining means.

FIG. 13 is a flow chart 1300 illustrating a possible manufacturing process of the optocoupler 400, described in FIG. 4. In step 1310, a plurality of conductors is provided. The plurality of conductors may be in a form of leads of a lead frame. In step 1320, an optical transmitter die and an optical receiver die may be attached to one or more of the conductors of the lead frame. For example, an epoxy material for die attach may be applied to the back surface of the dies, followed by attaching the die to a suitable portion of the lead frame. The method 1300 may then proceed to step 1330, in which the optical transmitter and receiver dies are wire bonded to the respective conductors of the lead frame, such that electrical connection may be established. For example, the optical transmitter die may be connected to a first power supply, whereas the optical receiver die may be connected to a second power supply that is isolated from the first power supply.

The method 1300 may next proceed to step 1340, in which a light guide defining element may be attached to the conductors of the lead frame or the PCB substrate, such that the optical transmitter and receiver dies are located within or in the vicinity of the cavity of the light guide defining element. In step 1350, a transparent encapsulant in liquid form is injected into the cavity of the light guide defining element to encapsulate the optical transmitter and receiver dies. The transparent encapsulant may also encapsulate and protect all the bond wires bonding the dies to the conductors.

The method 1300 may next proceed to step 1360, in which the transparent encapsulant may be cured into a solid to form a light guide. Optionally, after step 1360, an adhesive tape can be applied to the side of lead frame opposite the light guide defining element so that the light guide is surrounded by the light guide defining element and the tape.

The method 1300 may next proceed to step 1370, which starts with a first molding process to form the lower portion of the body to encapsulate a portion of the conductors. This may be followed by another molding process to form the upper portion of the body encapsulating the light guide defining element, the conductors and subsequently all the dies. The upper and lower portions of the body may be formed in the other order, with the upper portion formed first and the lower portion formed second. Finally, method 1300 may proceed to step 1380, in which the conductors may be cut from the lead frame and bent into leads of a specific package.

Although specific embodiments of the invention have been described and illustrated, the invention is not to be limited to the specific forms or arrangements of parts so described and illustrated. It is to be understood that the illustration and description shall not be interpreted narrowly. For example, the optical transmitter die 220 may be an LED, but may also be a die with an integrated LED and circuitry or a light source using future technologies. The scope of the invention is to be defined by the claims appended hereto and their equivalents.

What is claimed is:

1. A packaging for an optocoupler, comprising:
    a first optical transmitter die configured to emit light;
    a first optical receiver die, the first optical receiver die configured to receive light emitted by the first optical transmitter die;
    a plurality of conductors, the first optical transmitter die and the first optical receiver die being attached to at least one of the plurality of conductors;
    a light guide, the light guide being a substantially transparent encapsulant encapsulating the first optical transmitter die and the first optical receiver die, the light guide configured to transfer light from the first optical transmitter die to the first optical receiver die;
    an attachment member;
    a light guide defining element attached to at least one of the plurality of conductors through the attachment member, the light guide defining element and the attachment member providing at least one cavity configured to bound the substantially transparent encapsulant, so as to define the shape of the transparent encapsulant of the light guide defining element as the transparent encapsulant is hardened from liquid form; and
    an opaque encapsulant encapsulating the light guide defining element and partially encapsulating the plurality of conductors,
    wherein the light guide defining element is formed from one of: polycarbonate, high index plastic and acrylic plastic materials.

2. The packaging of claim 1, wherein one of the plurality of conductors defines a conductive pad, and wherein one of the first optical transmitter die and the first optical receiver die is attached directly to the conductive pad, the other one of the first optical transmitter die and the first optical receiver die is attached to the conductive pad via three layers of materials comprising an isolation layer sandwiched between two securing layers.

3. The packaging of claim 1, further comprising a tape, wherein the substantially transparent encapsulant is bounded by the light guide defining element and the tape.

4. The packaging of claim 1, wherein the attachment member is a non-conductive epoxy material.

5. The packaging of claim 1, further comprising a second optical transmitter die and a second optical receiver die.

6. The packaging of claim 5, wherein the first optical transmitter die and the first optical receiver die are encapsulated by the substantially transparent encapsulant within the cavity of the light guide defining element.

7. The packaging of claim 5, wherein the light guide defining element comprises a second cavity, such that the first optical transmitter die and the second optical receiver die are located in vicinity of one of the two cavities, and the second optical transmitter die and the second optical receiver die are located in the vicinity of another of the two cavities.

8. The packaging of claim 7, wherein the two cavities are optically separated through an optical separation element.

9. The packaging of claim 1, wherein the packaging forms a portion of an optocoupler.

10. The packaging of claim 1, wherein the light guide defining element comprises an aperture configured to prevent air from being trapped inside the at least one cavity.

11. An optocoupler comprising:
    a plurality of conductive leads;
    a first optical transmitter die configured to emit light, the first optical transmitter die configured to receive power through one of the plurality of conductive leads;
    a first optical receiver die configured to receive light emitted by the first optical transmitter die, the first optical receiver die configured to be powered to receive power through one of the plurality of conductive leads;
    a substantially transparent encapsulant at least partially encapsulating at least a portion of the plurality of conductive leads, the first optical transmitter die and the first optical receiver die, the substantially transparent encapsulant configured to form a light guide to transfer light from the first optical transmitter die to the first optical receiver die;
    a light guide defining element, the light guide defining element having at least one cavity configured to bound the substantially transparent encapsulant, so as to define the shape of the substantially transparent encapsulant as the substantially transparent encapsulant is hardened from liquid form; and
    an opaque encapsulant encapsulating the light guide defining element and a substantial portion of the plurality of conductive leads;
    wherein the light guide defining element is formed from one of: polycarbonate, high index plastic and acrylic plastic materials.

12. The optocoupler of claim 11, wherein one of the plurality of conductive leads defines a conductive pad, and wherein one of the first optical transmitter die and the first optical receiver die is attached directly to the conductive pad, the other one of the first optical transmitter die and the first optical receiver die is attached to the conductive pad via three layers of materials comprising an isolation layer sandwiched between two securing layers.

13. The optocoupler of claim 11, wherein the light guide defining element is attached to a portion of the plurality of conductive leads using an attachment member.

14. The optocoupler of claim 13, wherein the attachment member is a non-conductive epoxy.

15. The optocoupler of claim 11, further comprising a second optical transmitter die and a second optical receiver die, wherein the second optical transmitter die and the second optical receiver die are encapsulated by the substantially transparent encapsulant within the at least one cavity of the light guide defining element.

16. The optocoupler of claim 11, wherein the light guide defining element comprises a second cavity, and wherein the optocoupler further comprises a second optical transmitter die and a second optical receiver die, wherein the first optical transmitter die and the first optical receiver die are located in the vicinity of either the at least one cavity or the second cavity, and the second optical transmitter die and the optical receiver die are located in vicinity of the another of the at least one cavity or the second cavities.

17. The optocoupler of claim 16, wherein the at least one cavity and the second cavity are optically separated through an optical separation means.

18. The optocoupler of claim 11, wherein the light guide defining element comprises an aperture configured to prevent air from being trapped inside the at least one cavity.

19. An optocoupler comprising:
a substrate;
a first optical transmitter die located on the substrate configured to emit light, the first optical transmitter die configured to receive a first power;
a first optical receiver die located on the substrate, the first optical receiver die configured to receive light emitted by the first optical transmitter die and configured to receive a second power;
a substantially transparent encapsulant encapsulating a portion of the substrate, the first optical transmitter die and the first optical receiver die, wherein the substantially transparent encapsulant is hardened from liquid form to fowl a light guide configured to transfer light from the first optical transmitter die to the first optical receiver die;
a light guide defining element attached to the substrate, the light guide defining element having a cavity configured to bound the substantially transparent encapsulant when the transparent encapsulant is in liquid form and define therein at least a portion of the shape of the substantially transparent encapsulant to form the light guide;
an aperture on the light guide defining element configured to prevent air from being trapped inside the cavity; and
an opaque encapsulant encapsulating the light guide defining element and a substantial portion of the substrate.

* * * * *